United States Patent
Lou et al.

(10) Patent No.: US 11,828,789 B2
(45) Date of Patent: Nov. 28, 2023

(54) TEST APPARATUS AND JUMPER THEREOF

(71) Applicant: STAR TECHNOLOGIES, INC., Hsinchu (TW)

(72) Inventors: Choon Leong Lou, Hsinchu (TW); Yi Ming Lau, Hsinchu (TW)

(73) Assignee: STAR TECHNOLOGIES, INC., Hsinchu (TW)

( * ) Notice: Subject to any disclaimer, the term of this patent is extended or adjusted under 35 U.S.C. 154(b) by 0 days.

(21) Appl. No.: 17/721,078

(22) Filed: Apr. 14, 2022

(65) Prior Publication Data

US 2023/0123340 A1 Apr. 20, 2023

(30) Foreign Application Priority Data

Oct. 15, 2021 (TW) .................... 110138425

(51) Int. Cl.
| | | |
|---|---|---|
| *G01R 31/00* | (2006.01) | |
| *G01R 31/28* | (2006.01) | |
| *G01R 31/3187* | (2006.01) | |
| *G01R 1/02* | (2006.01) | |
| *G01R 1/04* | (2006.01) | |
| *G01R 1/067* | (2006.01) | |
| *G01R 1/073* | (2006.01) | |

(52) U.S. Cl.
CPC ...... *G01R 31/2853* (2013.01); *G01R 1/06711* (2013.01); *G01R 31/2886* (2013.01)

(58) Field of Classification Search
CPC ........ G01R 31/00; G01R 31/02; G01R 31/28; G01R 31/2853; G01R 31/2886; G01R 31/31; G01R 31/3187; G01R 1/02; G01R 1/04; G01R 1/067; G01R 1/073
See application file for complete search history.

(56) References Cited

U.S. PATENT DOCUMENTS

| | | | |
|---|---|---|---|
| 9,759,741 B2 * | 9/2017 | Park ................. | G01R 1/0408 |
| 2010/0213960 A1 | 8/2010 | Mok et al. | |
| 2012/0049873 A1 * | 3/2012 | Bourstein ......... | G01R 31/3004 |
| | | | 324/750.01 |
| 2012/0293195 A1 | 11/2012 | Bourstein | |

FOREIGN PATENT DOCUMENTS

TW 201221980 A 6/2012

OTHER PUBLICATIONS

TWOA of corresponding TW201221980A with partial translation dated Jun. 6, 2022 from the Taiwan corresponding application; 9 pages.

\* cited by examiner

*Primary Examiner* — Neel D Shah
(74) *Attorney, Agent, or Firm* — Muncy, Geissler, Olds & Lowe (57) ABSTRACT

The present disclosure provides a test apparatus and a jumper thereof. The test apparatus includes a base board and the jumper. The base board has a first slot and a second slot. The first slot has a plurality of electrical contacts, and is configured to receive a plurality of pins of a device under test. The jumper is inserted into the second slot. The jumper includes a body and a plurality of first circuits. The first circuits are disposed on the body and electrically connect the electrical contacts of the first slot to a plurality of pins of a tester.

17 Claims, 5 Drawing Sheets

TEST APPARATUS AND JUMPER THEREOF

TECHNICAL FIELD

The present disclosure relates to a test apparatus, and more particularly, to a test apparatus and a jumper thereof.

DISCUSSION OF THE BACKGROUND

Electrical testing is an important step in preparation processes of integrated circuit chips (IC chips). Each IC chip needs to be tested at a wafer stage and a packaging stage to ensure its electrical functions. In order to test the electrical functions of the IC chip at the packaging stage, the IC chip is electrically connected to a tester by using a circuit board to allow the tester to test the IC chip.

Since different IC chips have different circuit characteristics and pin arrangements, each IC chip needs a dedicated circuit board so that it can be electrically connected to the tester correctly for testing. However, costs of manufacturing a dedicated circuit board for each IC chip is high, and flexibility of use is extremely low.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One embodiment of the present disclosure provides a test apparatus. The test apparatus includes a base board and a jumper. The base board has a first slot and a second slot. The first slot has a plurality of electrical contacts and is configured to receive a plurality of pins of a device under test. The jumper is disposed in the second slot and includes a body and a plurality of first circuits. The first circuits are disposed on the body and electrically connect the electrical contacts of the first slot to a plurality of pins of a tester.

In some embodiments, the test apparatus further includes a load board for receiving the base board.

In some embodiments, the jumper is detachably inserted into the second slot.

In some embodiments, the material of the plurality of first circuits includes gold.

In some embodiments, the jumper further includes a passive component. The passive component is connected to one circuit of the plurality of first circuits.

Another embodiment of the present disclosure provides a jumper detachably attached to a base board. The base board has a first slot. The first slot is electrically connected to the jumper. The first slot has a plurality of electrical contacts. The first slot is configured to receive a plurality of pins of a device under test. The jumper includes a body and a plurality of first circuits. The plurality of first circuits are disposed on the body and electrically connect the electrical contacts of the first slot to a plurality of pins of a tester.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following description of the present disclosure is accompanied by figures that are incorporated into and constitute a part of the specification to illustrate embodiments of the present disclosure, but the present disclosure is not limited to the embodiments. In addition, the following embodiments can be appropriately integrated to complete another embodiment.

Terms such as "one embodiment," "embodiment," "exemplary embodiment," "other embodiments," "another embodiment," etc. indicate that the embodiments described in this disclosure may include specific features, structures or characteristics. However, not every embodiment has to include the specific features, structures or characteristics. Furthermore, repeated use of the term "in an embodiment" does not necessarily refer to a same embodiment, although it may.

In order to make the present disclosure fully understandable, the following description provides detailed steps and structures. Obviously, specific details known to those skilled in the art are not limited by implementation of the present disclosure. In addition, known structures and steps will not be described in detail, so as not to unnecessarily limit the present disclosure. Preferred embodiments of the present disclosure are described in detail as follows. However, in addition to detailed descriptions, the present disclosure can also be widely implemented in other embodiments. The scope of this disclosure is not limited to the content of the detailed description, but is defined by the appended claims.

It should be realized that the following disclosure provides many different embodiments, or examples, for implementing different features of the provided subject matter. Specific examples of components and arrangements are described below to simplify the present disclosure. These are, of course, merely examples and are not intended to be limiting. For example, sizes of elements are not limited to the disclosed range or value, but may depend on process conditions and/or desired properties of a device. In addition, formation of a first feature over or on a second feature in the description that follows may include embodiments in which the first and second features are formed in direct contact, and may also include embodiments in which additional features may be formed between the first and second features, such that the first and second features may not be in direct contact. For sake of brevity and clarity, dimensions of the various features may be arbitrarily increased or reduced. In the figures, some layers or features may be omitted for simplicity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
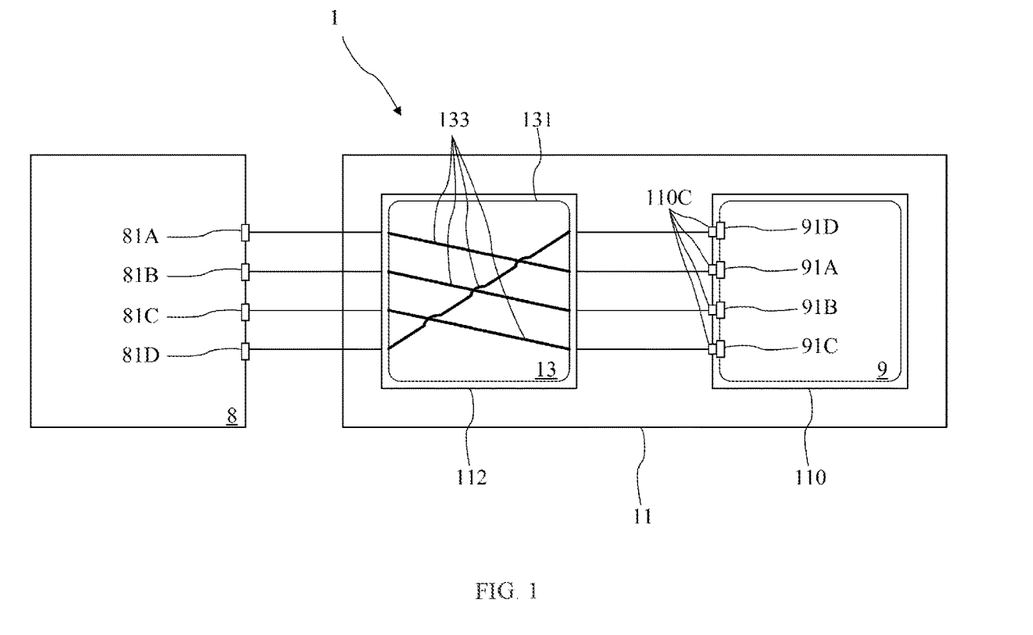
FIG. 1 is a schematic diagram illustrating a test apparatus in accordance with some embodiments of the present disclosure.

Please refer to FIG. 1, which is a schematic diagram illustrating a test apparatus 1 in accordance with some embodiments of the present disclosure. The test apparatus 1 includes a base board 11 and a jumper 13. In some embodiments, when an operator wants to use a tester 8 to test the electrical functions of a device under test 9, the operator may attach the device under test 9 to the base board 11 and electrically connect a plurality of pins of the device under test 9 to a plurality of corresponding pins of the tester 8 using the jumper 13.

Specifically, the base board 11 has a first slot 110 and a second slot 112. The first slot 110 and the second slot 112 are electrically connected, and the second slot 112 and the tester 8 are electrically connected. The first slot 110 has a plurality of electrical contacts 110C. The first slot 110 is configured to receive the plurality of pins 91A to 91D of the device under test 9. When the first slot 110 receives the device under test 9, the electrical contacts 110C are electrically connected to the plurality of pins 91A to 91D.

The jumper 13 is inserted into the second slot 112 and includes a body 131 and a plurality of first circuits 133 disposed on the body 131. The plurality of first circuits 133 electrically connect the electrical contacts 110C of the first slot 110 to the plurality of pins 81A to 81D of the tester 8. Accordingly, when the first slot 110 receives the device under test 9, the plurality of pins 91A to 91D of the device under test 9 are electrically connected to the plurality of pins 81A to 81D of the tester 8. Therefore, the operator can use the tester 8 to perform electrical tests on the device under test 9.

In some embodiments, there is a correspondence between the plurality of pins 81A to 81D of the tester 8 and the plurality of pins 91A to 91D of the device under test 9, and the configuration and layout of the plurality of first circuits 133 of the jumper 13 are configured to electrically connect each pin 91A to 91D of the device under test 9 to the corresponding pin 81A to 81D of the tester 8.

For example, as shown in FIG. 1, the plurality of pins 81A to 81D of the tester 8 are arranged in the order of 81A, 81B, 81C, 81D, and the plurality of pins 91A to 91D of the device under test 9 are arranged in the order of 91D, 91A, 91B, 91C.

In the prior art, when the operator wants to use the tester 8 to perform an electrical test on the device under test 9, the pins 91A to 91D have to be electrically connected to the pins 81A to 81D respectively by a direct wire-drawing process. That is, the pin 91A is electrically connected to the pin 81A, the pin 91B is electrically connected to the pin 81B, and so on.

In the present disclosure, based on the arrangement sequence of the plurality of pins 81A to 81D and the arrangement sequence of the plurality of pins 91A to 91D, the layout of the plurality of first circuits 133 of the jumper 13 is configured corresponding to the correspondence between the pins 91A to 91D of the device under test 9 and the pins 81A to 81D of the tester 8. In other words, the configuration and layout of the plurality of first circuits 133 of the jumper 13 are used to electrically connect the pins 91A to 91D of the device under test 9 to the pins 81A to 81D of the tester 8, respectively. Therefore, when the device under test 9 is inserted into the first slot 110 and the jumper 13 is inserted into the second slot 112, the jumper 13 can electrically connect the pins of the device under test 9 to the corresponding pins of the tester 8.

According to the aforementioned techniques of the present disclosure, when there is another device under test that needs to be electrically tested and the pin sequence of the another device under test is different from the pin sequence of the device under test 9, the another device under test and the tester 8 may be electrically connected by using another jumper, which is designed based on the correspondence between the pins of the another device under test and the pins of the tester 8, or by using a corresponding jumper without the need to manufacture another high-cost base board.

In the prior art, the pins 91A to 91D are electrically connected to the pins 81A to 81D respectively by a direct wire-drawing process. If gold (Au) is used as a wiring material, a cost is too high. If materials other than gold, such as copper or nickel, are used as the wiring material, a wire impedance is relatively high. In some embodiments, since gold has characteristics of low impedance and high conductivity, the plurality of first circuits 133 of the jumper 13 of the present disclosure may be made of gold or gold-containing materials, or may be gold-plated. Therefore, a parasitic resistance incurred by the jumper 13 can be reduced and an overall electrical conduction efficiency of the test apparatus 1 can be improved.

Figure 2A:
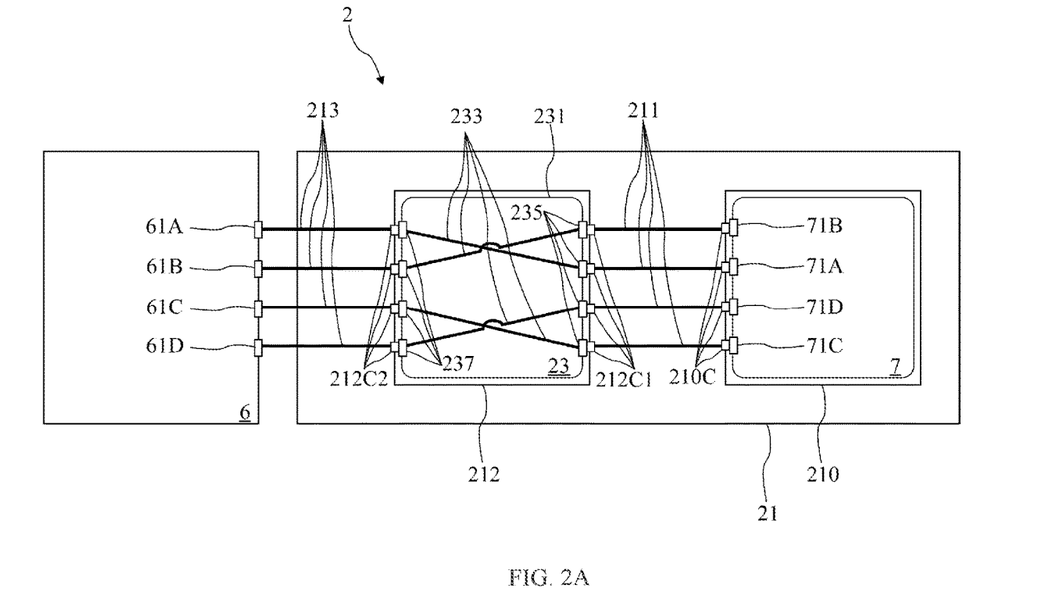
FIG. 2A is a schematic diagram illustrating a test apparatus in accordance with some embodiments of the present disclosure.

Please refer to FIG. 2A, which is a schematic diagram illustrating a test apparatus 2 in accordance with some embodiments of the present disclosure. The test apparatus 2 includes a base board 21 and a jumper 23. In some embodiments, when an operator wants to use a tester 6 to test the electrical functions of a device under test 7, for example, a dual in-line package (DIP) device, the operator may attach the device under test 7 to the base board 21 and electrically connect pins of the device under test 7 to corresponding pins of the tester 6 using the jumper 23. In some embodiments, the base board 21 includes a circuit board.

Specifically, the jumper 23 has a body 231, a plurality of first circuits 233, a plurality of first pins 235, and a plurality of second pins 237. The plurality of first pins 235 and the plurality of second pins 237 are electrically connected to the plurality of first circuits 233. The base board 21 has a first slot 210, a second slot 212, a plurality of second circuits 211, and a plurality of third circuits 213. The first slot 210 has a plurality of electrical contacts 210C. The second slot 212 has a plurality of electrical contacts 212C1 and a plurality of electrical contacts 212C2. The plurality of second circuits 211 are electrically connected to the electrical contacts 210C of the first slot 210 and the electrical contacts 212C1 of the second slot 212. The plurality of third circuits 213 are electrically connected to the electrical contacts 212C2 of the second slot 212 and the plurality of pins 61A to 61D of the tester 6.

In some embodiments, a path length of each of the plurality of second circuits 211 is equal to a shortest distance between the first slot 210 and the second slot 212. More specifically, the path length of each of the plurality of second circuits 211 is equal to a shortest distance between the corresponding electrical contacts 210C of the first slot 210 and the corresponding electrical contacts 212C1 of the second slot 212.

In some embodiments, a path length of each of the plurality of third circuits 213 is equal to a shortest distance between the second slot 212 and the tester 6. More specifically, the path length of each of the plurality of third circuits 213 is equal to a shortest distance between the corresponding electrical contacts 212C2 of the second slot 212 and the corresponding pins of the tester 6.

The first slot 210 is configured to receive the plurality of pins 71A to 71D of the device under test 7. When the first slot 210 receives the device under test 7, the electrical contacts 210C are electrically connected to the plurality of pins 71A to 71D. When the jumper 23 is inserted into the second slot 212, the plurality of first pins 235 of the jumper 23 are electrically connected to the electrical contacts 212C1 and the plurality of second circuits 211, while the plurality of second pins 237 of the jumper 23 are electrically connected to the electrical contacts 212C2 and the plurality of third circuits 213. Through this configuration, the plurality of first circuits 233 can electrically connect the electrical contacts 210C of the first slot 210 to the plurality of pins 61A to 61D of the tester 6. Accordingly, when the first slot 210 receives the device under test 7, the plurality of pins 71A to 71D of the device under test 7 are electrically connected to the plurality of pins 61A to 61D of the tester 6. Therefore, the operator can use the tester 6 to perform electrical tests on the device under test 7.

In some embodiments, there is a correspondence, for example, a one-to-one correspondence, between the plurality of pins 61A to 61D of the tester 6 and the plurality of pins 71A to 71D of the device under test 7. The configuration and layout of the plurality of first circuits 233 of the jumper 23 are configured to electrically connect each pin 71A to 71D of the device under test 7 to the corresponding pin 61A to 61D of the tester 6.

For example, as shown in FIG. 2A, the plurality of pins 61A to 61D of the tester 6 are arranged in the order of 61A, 61B, 61C, 61D, and the plurality of pins 71A to 71D of the device under test 7 are arranged in the order of 71B, 71A, 71D, 71C. In the prior art, when the operator wants to use the tester 6 to perform an electrical test on the device under test 7, the pins 71A to 71D have to be electrically connected to the pins 61A to 61D by a direct wire-drawing process. That is, the pin 71A is electrically connected to the pin 61A, the pin 71B is electrically connected to the pin 61B, and so on.

In the present disclosure, based on the arrangement sequence of the plurality of pins 61A to 61D and the arrangement sequence of the plurality of pins 71A to 71D, the layout of the plurality of first circuits 233 of the jumper 23 is configured corresponding to the correspondence between the pins 71A to 71D of the device under test 7 and the pins 61A to 61D of the tester 6. In other words, the configuration and layout of the plurality of first circuits 233 of the jumper 23 are configured to electrically connect the pins 71A to 71D of the device under test 7 to the pins 61A to 61D of the tester 6, respectively. Therefore, when the device under test 7 is inserted into the first slot 210 and the jumper 23 is inserted into the second slot 212, the jumper 23 can electrically connect the pins of the device under test 7 to the corresponding pins of the tester 6.

In some embodiments, the jumper 23 is detachably inserted into the second slot 212 of the base board 21, so the jumper 23 may be easily detached from or disposed on the base board 21 by the operator. Accordingly, when there is another device under test that needs to be electrically tested, and the pin sequence of the another device under test is different from the pin sequence of the device under test 7, the another device under test and the tester 6 may be electrically connected by using another jumper, which is designed based on the correspondence between the pins of the another device under test and the pins of the tester 6, or by using a corresponding jumper, while the jumper 23 is detached from the second slot 212 and replaced with the another redesigned jumper. There is no need to manufacture another high-cost base board such as a circuit board.

In the prior art, the pins 71A to 71D are electrically connected to the pins 61A to 61D, respectively, by a direct wire-drawing process. If gold is used as a wiring material, a cost is too high. If materials other than gold, such as copper or nickel, are used as the wiring material, a wire impedance is relatively high. In some embodiments, since gold has characteristics of low impedance and high conductivity, the plurality of first circuits 233, the plurality of first pins 235, and the plurality of second pins 237 of the jumper 23 of the present disclosure may be made of gold or gold-containing materials, or may be gold-plated. Therefore, a parasitic resistance incurred by the jumper 23 can be reduced and an overall electrical conduction efficiency of the test apparatus 2 can be improved.

Figure 2B:
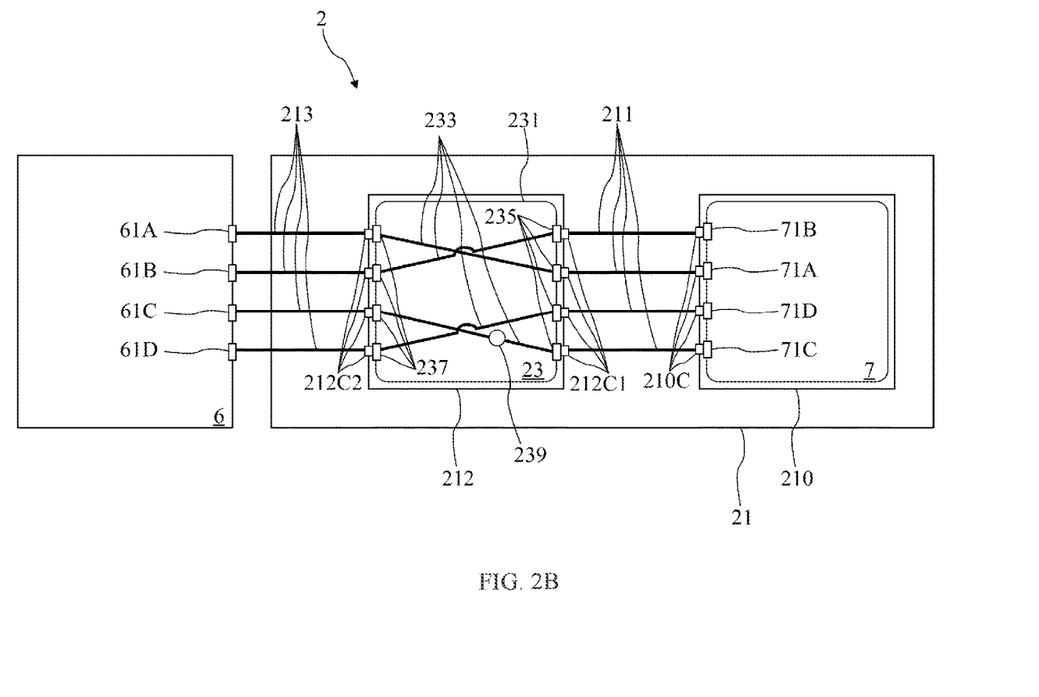
FIG. 2B is a schematic diagram illustrating a test apparatus in accordance with some embodiments of the present disclosure.

Please refer to FIG. 2B. In some embodiments, the jumper 23 further includes a passive component 239. In detail, the passive component 239 is connected to one circuit of the plurality of first circuits 233 to meet specific test requirements. In this way, since the passive component 239 may be inserted into the jumper 23 instead of being disposed on the base board 21, the passive component 239 may be altered by the jumper 23, and as such, the base board 21 may be prevented from being damaged by changing of passive components on the base board 21. Also, because the conductive path of the jumper 23 is made of gold-containing materials, an overall path impedance between the device under test 7 and the tester 6 may be reduced. Therefore, when the passive component 239 is introduced, the impedance caused by the passive component 239 can be compensated. A cost of reducing the impedance in this way is less than that of using a direct wire-drawing process with gold-containing materials on the pins 71A to 71D and the pins 61A to 61D.

In some embodiments, the passive component 239 includes passive electronic devices such as a resistor, a capacitor or an inductor. In some embodiments, the plurality of first circuits 233 and the passive component 239 are disposed inside the body 231. In other words, the plurality of first circuits 233 and the passive component 239 are packaged inside the body 231.

Figure 3A:
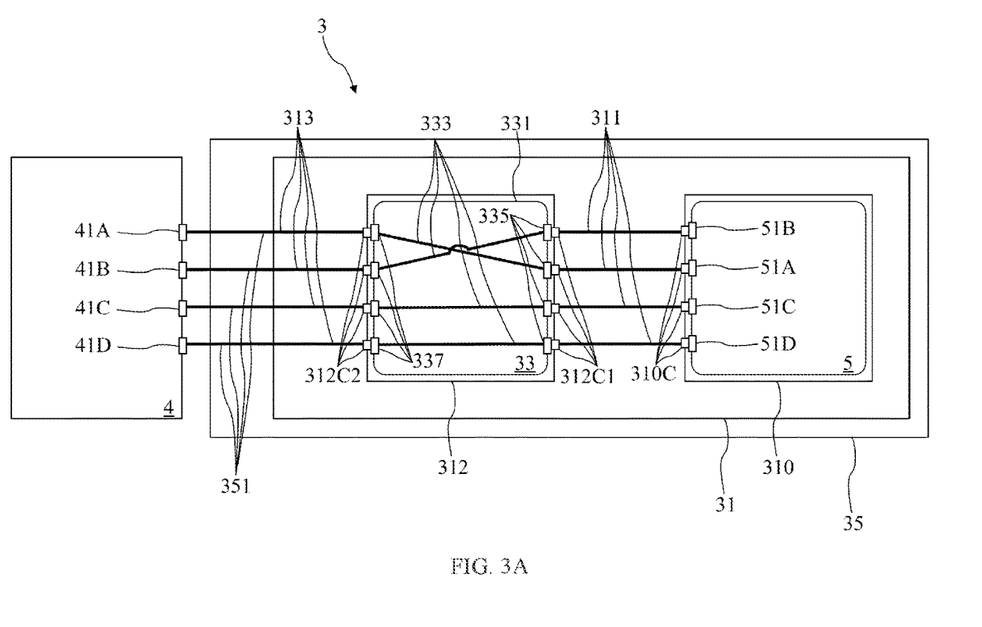
FIG. 3A is a schematic diagram illustrating a test apparatus in accordance with some embodiments of the present disclosure.

Please refer to FIG. 3A, which is a schematic diagram illustrating a test apparatus 3 in accordance with some embodiments of the present disclosure. The test apparatus 3 includes a base board 31, a jumper 33, and a load board 35. In some embodiments, when an operator wants to use a tester 4 to test electrical functions of a device under test 5, for example, a DIP device, the operator may attach the device under test 5 to the base board 31 and electrically connect pins of the device under test 5 to corresponding pins of the tester 4 using the jumper 33. In some embodiments, the base board 31 may be a circuit board or may include a circuit board.

Specifically, the jumper 33 has a body 331, a plurality of first circuits 333, a plurality of first pins 335, and a plurality of second pins 337. The plurality of first pins 335 and the plurality of second pins 337 are electrically connected to the plurality of first circuits 333. The base board 31 has a first slot 310, a second slot 312, a plurality of second circuits 311, and a plurality of third circuits 313. The first slot 310 has a plurality of electrical contacts 310C. The second slot 312 has a plurality of electrical contacts 312C1 and a plurality of electrical contacts 312C2. The load board 35 receives the base board 33 and has a plurality of fourth circuits 351. The plurality of second circuits 311 are electrically connected to the electrical contacts 310C of the first slot 310 and the electrical contacts 312C1 of the second slot 312. The plurality of third circuits 313 of the base board 31 are electrically connected to the electrical contacts 312C2 of the second slot 312 and the plurality of fourth circuits 351 of the load board 35. The plurality of fourth circuits 351 of the load board 35 are electrically connected to the plurality of third circuits 313 and the plurality of pins 41A to 41D of the tester 4.

In some embodiments, a path length of each of the plurality of second circuits 311 is equal to a shortest distance between the first slot 310 and the second slot 312. More specifically, the path length of each of the plurality of second circuits 311 is equal to a shortest distance between the corresponding electrical contacts 310C of the first slot 310 and the corresponding electrical contacts 312C1 of the second slot 312.

In some embodiments, a path length of each of the plurality of third circuits 313 is equal to a shortest distance between the second slot 312 and the plurality of fourth circuits 351 of the load board 35. More specifically, the path length of each of the plurality of third circuits 313 is equal to a shortest distance between the corresponding electrical contacts 312C2 of the second slot 312 and the corresponding fourth circuits 351 of the load board 35.

In some embodiments, a path length of each of the plurality of fourth circuits 351 is equal to a shortest distance between the plurality of third circuits 313 and the tester 4. More specifically, the path length of each of the plurality of fourth circuits 351 is equal to a shortest distance between the corresponding third circuits 313 and the corresponding pins of the tester 4.

The first slot 310 is configured to receive the plurality of pins 51A to 51D of the device under test 5. When the first slot 310 receives the device under test 5, the electrical contacts 310C are electrically connected to the plurality of pins 51A to 51D. When the jumper 33 is inserted into the second slot 312, the plurality of first pins 335 of the jumper 33 are electrically connected to the electrical contacts 312C1 and the plurality of second circuits 311, and the plurality of second pins 337 of the jumper 33 are electrically connected to the electrical contacts 312C2 and the plurality of third circuits 313. Through this configuration, the plurality of first circuits 333 can electrically connect the electrical contacts 310C of the first slot 310 to the plurality of pins 41A to 41D of the tester 4. Accordingly, when the first slot 310 receives the device under test 5, the plurality of pins 51A to 51D of the device under test 5 are electrically connected to the plurality of pins 41A to 41D of the tester 4. Therefore, the operator can use the tester 4 to perform electrical tests on the device under test 5.

In some embodiments, there is a correspondence, for example, a one-to-one correspondence, between the plurality of pins 41A to 41D of the tester 4 and the plurality of pins 51A to 51D of the device under test 5. The configuration and layout of the plurality of first circuits 333 of the jumper 33 are configured to electrically connect each pin 51A to 51D of the device under test 5 to the corresponding pin 41A to 41D of the tester 4.

For example, as shown in FIG. 3A, the plurality of pins 41A to 41D of the tester 4 are arranged in the order of 41A, 41B, 41C, 41D, and the plurality of pins 51A to 51D of the device under test 5 are arranged in the order of 51B, 51A, 51C, 51D. In the prior art, when the operator wants to use the tester 4 to perform an electrical test of the device under test 5, the pins 51A to 51D have to be electrically connected to the pins 41A to 41D respectively by a direct wire-drawing process. That is, the pin 51A is electrically connected to the pin 41A, the pin 51B is electrically connected to the pin 41B, and so on.

In the present disclosure, based on the arrangement sequence of the plurality of pins 41A to 41D and the arrangement sequence of the plurality of pins 51A to 51D, the layout of the plurality of first circuits 333 of the jumper 33 is configured corresponding to the correspondence between the pins 51A to 51D of the device under test 5 and the pins 41A to 41D of the tester 4. In other words, the configuration and layout of the plurality of first circuits 333 of the jumper 33 are configured to electrically connect the pins 51A to 51D of the device under test 5 to the pins 41A to 41D of the tester 4, respectively. Therefore, when the device under test 5 is inserted into the first slot 310 and the jumper 33 is inserted into the second slot 312, the jumper 33 can electrically connect the pins of the device under test 5 to the corresponding pins of the tester 4.

In some embodiments, the jumper 33 is detachably inserted into the second slot 312 of the base board 31, so that the jumper 33 may be easily detached from or disposed on the base board 31 by the operator. Accordingly, when there is another device under test that needs to be electrically tested and the pin sequence of the another device under test is different from the pin sequence of the device under test 5, the another device under test and the tester 4 may be electrically connected by using another jumper, which is designed based on the correspondence between the pins of the another device under test and the pins of the tester 5, or by using a corresponding jumper, while the jumper 33 is detached from the second slot 312 and replaced with the another redesigned jumper. There is no need to manufacture a high-cost base board such as a circuit board.

In the prior art, the pins 51A to 51D are electrically connected to the pins 41A to 41D, respectively, by a direct wire-drawing process. If gold is used as a wiring material, cost is too high. If materials other than gold, such as copper or nickel, are used as the wiring material, a wire impedance is relatively high. In some embodiments, since gold has characteristics of low impedance and high conductivity, the plurality of first circuits 333, the plurality of first pins 335, and the plurality of second pins 337 of the jumper 33 of the present disclosure may be made of gold or gold-containing materials, or may be gold-plated. As a result, a parasitic resistance incurred by the jumper 33 can be reduced and an overall electrical conduction efficiency of the test apparatus 3 can be improved.

In some embodiments, a path length of each of the plurality of first circuits 333 is equal to a shortest distance between the connected first pin 335 and the connected second pin 337, which may further reduce an overall impedance and improve the electrical conduction efficiency. In some embodiments, in order to make the path length of each of the plurality of first circuits 333 equal to the shortest distance between the connected first pin 335 and the connected second pin 337, different first circuits 333 may be disposed at different depths of the jumper 33. As a result, winding or crossing-over of the plurality of first circuits 333 can be avoided, so as to reduce the impedance caused by redundant path length.

Figure 3B:
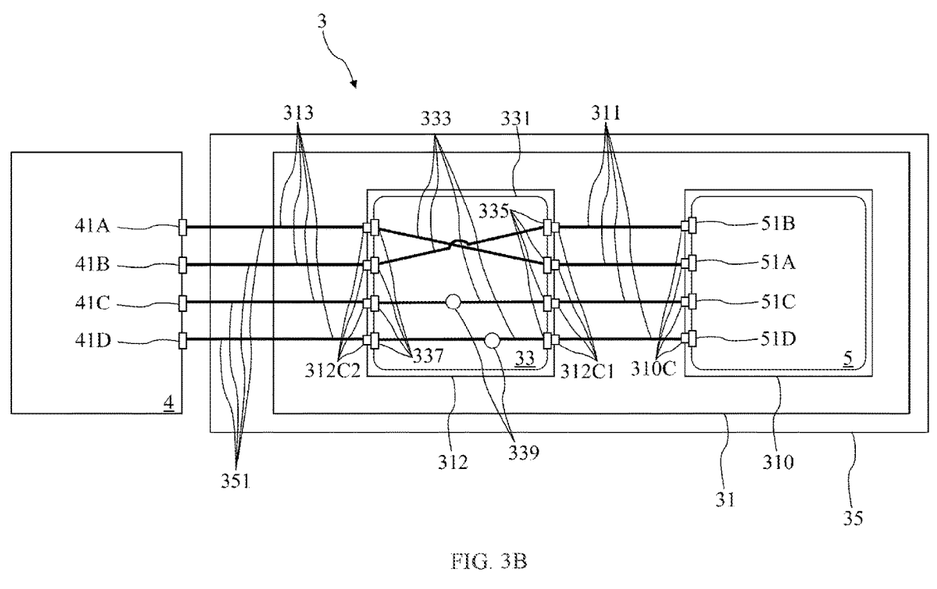
FIG. 3B is a schematic diagram illustrating a test apparatus in accordance with some embodiments of the present disclosure.

Please refer to FIG. 3B. In some embodiments, the jumper 33 further includes a plurality of passive components 339. In detail, the passive components 339 are connected to multiple circuits of the plurality of first circuits 333 to meet specific test requirements. With such arrangement, since the passive components 339 may be inserted into the jumper 33 instead of being disposed on the base board 31, the passive components 339 may be altered according to the jumper 33, and as such, the base board 31 may be prevented from being damaged by changing of passive components on the base board 31. In addition, because conductive paths of the jumper 33 are made of gold-containing materials, an overall path impedance between the device under test 5 and the tester 4 may be reduced. Therefore, when the passive components 339 is introduced, an impedance caused by the passive components 339 can be compensated. A cost of reducing the impedance using such configuration is less than that of using a direct wire-drawing process with gold-containing materials between the pins 51A to 51D and the pins 41A to 41D.

In some embodiments, the passive components 339 include passive electronic devices such as resistors, capacitors, or inductors. In some embodiments, the plurality of first circuits 333 and the plurality of passive components 339 are disposed inside the body 331. In other words, the plurality of first circuits 333 and the plurality of passive components 339 are packaged inside the body 331.

Although the present disclosure and its advantages have been described in detail, it should be understood that various changes, substitutions and alterations may be made herein without departing from the spirit and scope of the disclosure as defined by the appended claims. For example, many of the processes discussed above may be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A test apparatus, comprising:
a base board, having a first slot and a second slot, wherein the first slot is electrically connected to the second slot, and the first slot having a plurality of electrical contacts is configured to receive a plurality of pins of a device under test;
a jumper, inserted into the second slot, comprising:
a body; and
a plurality of first circuits, disposed on the body and electrically connecting the electrical contacts of the first slot to a plurality of pins of a tester;
wherein the base board has a plurality of second circuits electrically connected to the first slot and the second slot.

2. The test apparatus of claim 1, wherein a path length of each of the plurality of second circuits is equal to a shortest distance between the first slot and the second slot.

3. The test apparatus of claim 2, wherein the base board has a plurality of third circuits, electrically connected to second slot and the plurality of pins of the tester, and a path length of each of the plurality of third circuits is equal to a shortest distance between the second slot and the tester.

4. The test apparatus of claim 3, wherein the jumper further comprises:
a plurality of first pins, electrically connected to the plurality of first circuits; and
a plurality of second pins, electrically connected to the plurality of first circuits.

5. The test apparatus of claim 4, wherein a path length of each of the plurality of first circuits is equal to a shortest distance between the connected first pin and the connected second pin.

6. The test apparatus of claim 4, wherein when the jumper is inserted into the second slot, the plurality of first pins of the jumper are electrically connected to the plurality of second circuits, and the plurality of second pins of the jumper are electrically connected to the plurality of third circuits.

7. The test apparatus of claim 6, further comprising a load board, receiving the base board.

8. The test apparatus of claim 7, wherein the load board further comprises a plurality of fourth circuits, electrically connected to the plurality of third circuits and the plurality of pins of the tester.

9. The test apparatus of claim 1, wherein the jumper is detachably inserted into the second slot.

10. The test apparatus of claim 9, wherein a layout of the plurality of first circuits of the jumper is configured corresponding to a correspondence between the plurality of pins of the device under test and the plurality of pins of the tester.

11. The test apparatus of claim 1, wherein a material of the plurality of first circuits comprises gold.

12. The test apparatus of claim 11, wherein the jumper further comprises a passive component, and the passive component is connected to one circuit of the plurality of first circuits.

13. A jumper, detachably attached to a base board, the base board having a first slot, the first slot being electrically connected to the jumper, the first slot having a plurality of electrical contacts, the first slot being configured to receive a plurality of pins of a device under test, and the jumper comprising:
a body; and
a plurality of first circuits, disposed on the body and electrically connecting the electrical contacts of the first slot to a plurality of pins of a tester;
wherein the base board further has a second and a plurality of second circuits electrically connected to the first slot and the second slot.

14. The jumper of claim 13, wherein the base board has a plurality of third circuits, the second slot is configured to receive the jumper, the plurality of second circuits are electrically connected to the first slot and the second slot, the plurality of third circuits are electrically connected to the second slot and the plurality of pins of the tester, and the jumper further comprises:
- a plurality of first pins, electrically connected to the plurality of first circuits; and
- a plurality of second pins, electrically connected to the plurality of first circuits,
- wherein a path length of each of the plurality of second circuits is equal to a shortest distance between the first slot and the second slot,
- wherein a path length of each of the plurality of third circuits is equal to a shortest distance between the second slot and the tester.

15. The jumper of claim 14, wherein when the jumper is inserted into the second slot, the plurality of first pins of the jumper electrically connect to the plurality of second circuits, and the plurality of second pins of the jumper electrically connect to the plurality of third circuits.

16. The jumper of claim 13, wherein a material of the plurality of first circuits comprises gold.

17. The jumper of claim 16, further comprising:
- a passive component, connected to one circuit of the plurality of first circuits.

* * * * *